United States Patent [19]

Mueller-Hess et al.

[11] Patent Number: 5,238,772
[45] Date of Patent: Aug. 24, 1993

[54] PHOTOPOLYMERIZABLE MIXTURE AND RECORDING MATERIAL CONTAINING FREE-RADICALLY POLYMERIZABLE COMPOUND, PHOTOSENSITIVE POLYMERIZATION INITIATOR AND POLYURETHANE BINDER GRAFTED WITH VINYL ALCOHOL AND VINYL ACETAL UNITS

[75] Inventors: Waltraud Mueller-Hess, Wiesbaden; Dieter Mohr, Budenheim; Karl-Josef Rauterkus; Matthias Kroggel, both of Kelkheim, all of Fed. Rep. of Germany

[73] Assignee: Hoechst Aktiengesellschaft, Frankfurt am Main, Fed. Rep. of Germany

[21] Appl. No.: 826,633

[22] Filed: Jan. 23, 1992

Related U.S. Application Data

[63] Continuation of Ser. No. 541,795, Jun. 21, 1990, abandoned.

[30] Foreign Application Priority Data

Jun. 21, 1989 [DE] Fed. Rep. of Germany ....... 3920229

[51] Int. Cl.⁵ .................. G03F 7/021; G03F 7/035
[52] U.S. Cl. .................................. 430/175; 430/157; 430/176; 430/270; 430/281; 430/283; 430/906
[58] Field of Search ............... 430/157, 175, 176, 197, 430/284, 906, 281, 270, 283

[56] References Cited

U.S. PATENT DOCUMENTS

| | | | |
|---|---|---|---|
| 3,556,791 | 1/1971 | Suzuki et al. | 430/271 |
| 3,630,746 | 12/1971 | Takimoto et al. | 430/281 |
| 3,732,105 | 5/1973 | Klupfel et al. | 430/281 |
| 4,186,017 | 1/1980 | Palmer | 430/162 |
| 4,387,151 | 6/1983 | Bosse et al. | 430/175 |
| 4,526,854 | 7/1985 | Watanabe et al. | 430/176 |
| 4,631,245 | 12/1986 | Pawlowski | 430/175 |
| 4,659,645 | 4/1987 | Frommeld et al. | 430/175 |

FOREIGN PATENT DOCUMENTS 246047 10/1987 Japan .................. 430/284

Primary Examiner—Charles L. Bowers, Jr.
Assistant Examiner—Christopher G. Young
Attorney, Agent, or Firm—Foley & Lardner

[57] ABSTRACT

A photopolymerizable mixture is disclosed which contains:
- a) a graft copolymer having a polyurethane as the graft backbone, onto chains containing vinyl alcohol units and vinyl acetal units are grafted,
- b) a free-radically polymerizable compound possessing at least one terminal ethylenically unsaturated group and having a boiling point of more than 100° C. at normal pressure, and
- c) a compound or a combination of compounds which under the action of actinic light is capable of initiating the polymerization of compound b).

The mixture is suitable for use in the production of printing plates and photoresists. It is distinguished by high photospeed and can be developed with aqueous solutions. It yields printing plates producing large print runs.

13 Claims, No Drawings

PHOTOPOLYMERIZABLE MIXTURE AND RECORDING MATERIAL CONTAINING FREE-RADICALLY POLYMERIZABLE COMPOUND, PHOTOSENSITIVE POLYMERIZATION INITIATOR AND POLYURETHANE BINDER GRAFTED WITH VINYL ALCOHOL AND VINYL ACETAL UNITS

This application is a continuation of application Ser. No. 07/541,795, filed Jun. 21, 1990 now abandoned.

BACKGROUND OF THE INVENTION

The present invention relates to a photopolymerizable mixture that can be developed with aqueous solutions, containing a polymeric binder, a polymerizable compound having at least one ethylenically-unsaturated double bond in the molecule, and a photoinitiator or photoinitiator system. This mixture is suitable for the production of photosensitive recording materials, in particular of planographic printing plates and photoresists.

Photopolymerizable mixtures containing water-soluble binders are described in DE 15 22 362 and DE 19 17 917. As a rule, these mixtures can be developed readily and without scumming, but they suffer from the disadvantage that in planographic printing the hardened image areas, which contain the water-soluble binder, are wetted more easily by the dampening solutions and are attacked by the latter during the production of high print runs.

Mixtures of the above generic type are also described in DE 20 53 363. The binders described therein comprise reaction products obtained from a polymer containing hydroxyl groups or amino groups and at least one saturated alkyl sulfonyl isocyanate, alkoxy sulfonyl isocyanate, aryl sulfonyl isocyanate or aryloxy sulfonyl isocyanate. In combination with diazonium salt condensation products or photopolymerizable mixtures, the binder is processed to give photosensitive layers. However, the resulting mixtures can only be developed with aqueous-alkaline solutions if the binders employed have high acid numbers, which adversely affect the abrasion resistance and printing properties of the hardened layers.

EP 167 963 describes a negative-working photosensitive mixture suitable for the production of planographic printing plates comprising a diazonium salt polycondensation product, an ethylenically-unsaturated compound which can be polymerized by a free-radical process, a photo-initiator and a water-insoluble polymeric binder. High print runs can be achieved when polyvinyl acetals are used as binders. In this case development can, however, only be performed with solutions comprising predominantly organic solvents.

In DE 37 32 089 graft polymers are described, which comprise a polyurethane as the graft backbone and grafted-on vinyl ester units, which are at least partially saponified to give vinyl alcohol units. The polymers are suitable as binders for pigments; for preparing printing inks, thermoplastic adhesives and solvent-containing adhesives; as constituents of varnishes or coatings for fibers, films and metals, and for thermoplastic shaped articles.

JP 246,047/87 describes photopolymerizable mixtures wherein graft polymers of polyurethanes and polyvinyl alcohol with mercapto groups are contained as binders.

Graft polymers obtained from the graft polymers described in DE 37 32 089 above, by acetalizing with aldehydes, are described in German Patent Application P 38 35 840.9.

German Patent Application P 38 24 146.3 discloses photocurable elastomeric mixtures containing a compound polymerizable by a free-radical process, a photoinitiator and, as the binder, a graft polymer according to DE 37 32 089, which is soluble or dispersible in an aqueous solution.

SUMMARY OF THE INVENTION

It is therefore an object of the present invention to provide a photopolymerizable mixture which is suitable for use in the production of printing plates, particularly lithographic printing plates, or of photoresists; which has all the advantages of the known photopolymerizable compositions; which can be developed by means of virtually solvent-free, aqueous solutions, without resulting in disturbing deposits when developer solutions containing tap water are employed; and which, at the same time, yields printing plates of high photospeed and image resolution, which give high print runs and have a good ink acceptance and long shelf life. Up to now, these properties could only be achieved with printing plates requiring the addition of relatively large amounts of organic solvents in the developing process.

In accordance with these and other objects, the present invention provides a photopolymerizable mixture comprising:
 (a) a polymeric binder possessing repeating vinyl acetal units,
 (b) a free-radically polymerizable compound possessing at least one terminal ethylenically-unsaturated group and having a boiling point of more than about 100° C. at normal pressure, and
 (c) a compound or a combination of compounds which, under the action of actinic light, is capable of initiating the polymerization of compound (b),
wherein the binder is a graft polymer obtained from a polyurethane graft backbone, onto which chains containing vinyl alcohol units and vinyl acetal units are grafted.

A photopolymerizable recording material comprising a layer of this photopolymerizable mixture on a layer support is also provided.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

In accordance with the instant invention, a photopolymerizable mixture is provided which contains, as essential constituents,
 (a) a polymeric binder possessing repeating vinyl acetal units,
 (b) a free-radically polymerizable compound possessing at least one terminal ethylenically-unsaturated group and having a boiling point of more than about 100° C. at normal pressure, and (c) a compound or a combination of compounds which under the action of actinic light is capable of initiating the polymerization of compound (b).

The mixture of this invention is characterized in that the binder is a graft polymer where the graft backbone is a polyurethane onto which chains containing vinyl alcohol units and vinyl acetal units are grafted. In accordance with the instant invention, a photopolymerizable recording material is provided that comprises a layer support and a photopolymerizable layer comprising this mixture.

The graft polymers contained in the mixture of the instant invention are described in German Patent Application P 38 35 840.9. To prepare them, a carboxylic acid vinyl ester and optionally another ethylenically-unsaturated compound copolymerizable therewith is grafted onto a polyurethane graft backbone and saponified completely or partially. The polymers having vinyl alcohol units that are obtained in this way are further reacted with aldehydes to give polyvinyl acetals.

The proportion of the grafted-on components is generally about 10 to 95, preferably about 30 to 90, and in particular about 40 to 80, % by weight, based on the total graft polymer.

The graft backbones consist of polyurethanes having at least two urethane groups in the molecule, the number of urethane groups per molecule being subject to no particular upper limit and generally having values higher than 2.

The polyurethanes employed as graft backbones can be produced from diols and diisocyanates by conventional processes of polyurethane synthesis. In principle, all of the diols customarily used in polyurethane synthesis can be employed. Cycloaliphatic diols, such as cyclohexanediols, and in particular aliphatic diols having 2 to 12 carbon atoms are preferred. Polyetherdiols, for example, polypropylene oxides, polybutylene oxides and copolymers of ethylene oxide, propylene oxide and butylene oxide, preferably the block copolymers thereof, are also preferred; polyethylene oxides with molecular weights between about 200 and 10,000, and more preferably between about 400 and 1,500 are particularly preferred. The polyetherdiols are advantageously employed in combination with low-molecular aliphatic diols, for example 1,4-butanediol, 1,3-propanediol, ethylene glycol, diethylene glycol, 1,2-hexanediol, 1,2-propanediol, pentanediol or cyclohexanediol. The molar ratio of polyetherdiol to low-molecular aliphatic diol is preferably from 1:0.1 to 1:0.7.

Aromatic diisocyanate components can be employed, but aliphatic and/or cycloaliphatic diisocyanates are preferred. Preferred aliphatic diisocyanates are those having 2 to 12 carbon atoms in the aliphatic radical, for example, ethylene diisocyanate, propylene diisocyanate, tetramethylene diisocyanate and 2,2,4-trimethyl-hexamethylene diisocyanate. Preferred cycloaliphatic diisocyanates are, for example, 1,4-diisocyanatocyclohexane, dicyclohexylmethane-4,4'-diisocyanate and isophorone diisocyanate. Hexamethylene diisocyanate and isophorone diisocyanate are particularly preferred.

The molar ratio of diol component to diisocyanate component is preferably between about 1:0.99 and 1:0.5, in particular between about 1:0.98 and 1:0.7. The average molecular weights of the polyurethanes are preferably between about 200 and 100,000, in particular between about 1,000 and 50,000, and more particularly between about 3,000 and 25,000.

Carboxylic acid vinyl esters having 3 to 20 and preferably 4 to 14 carbon atoms are employed for grafting onto the polyurethane. Vinyl acetate and/or vinyl propionate, in particular vinyl acetate, are particularly preferred.

Mixtures of vinyl acetate and/or vinyl propionate and vinyl versatate are also preferred. Particularly when there is partial or complete saponification of the products following the graft polymerization, the co-use of vinyl propionate in addition to vinyl acetate during grafting is advantageous. Moreover, copolymerizable mixtures of carboxylic acid vinyl esters can be grafted, preferably mixtures of vinyl acetate and minor amounts of vinyl versatate.

Grafting with different carboxylic acid vinyl esters in the form of block copolymers, optionally in combination with further ethylenically-unsaturated and copolymerizable monomers, can also be advantageous. Furthermore, the carboxylic acid vinyl esters can also be grafted together with other ethylenically-unsaturated and copolymerizable monomers, in particular acids, such as maleic acid, itaconic acid, mesaconic acid, crotonic acid, acrylic acid or the esters thereof.

The graft polymers obtained can be converted by hydrolysis, alcoholysis or transesterification into partially or completely saponified products, the degree of hydrolysis being at least about 30 mol %, and preferably about 45 to 99 mol %, based on the mole number of saponifiable monomer units in the graft polymer. The production of graft polymers with a polyurethane graft backbone is described in DE 37 32 089.

The saponified graft polymers can be acetalized in an acidic medium by means of known methods. Aliphatic aldehydes having 1 to 20 carbon atoms, which may be substituted, and aromatic aldehydes, which may also be substituted, are employed for acetalizing. Preference is given to aliphatic aldehydes having 1 to 5 carbon atoms, such as n-butyraldehyde, isobutyraldehyde, propionaldehyde or formaldehyde. Substituted or unsubstituted benzaldehydes, such as benzaldehyde, p-chlorobenzaldehyde or p-methoxybenzaldehyde are also suitable. It is also possible to employ combinations of several of these aldehydes.

The degree of acetalization of the graft polyvinyl acetals used as binders in accordance with this invention is preferably selected such that the content of non-acetalized polyvinyl alcohol units in the graft polyvinyl acetals is about 18 to 60 mol %, and particularly preferably about 20 to 45 mol %, in each case relative to the molar amount of vinyl alcohol units contained in the saponified graft polymers used, it being possible for up to about 55 mol %, relative to the original amount, to be present as vinyl ester units. The hydroxyl number of the ready-for-use binder should be in the range of about 100 to 600, and preferably of about 200 to 500.

The acetalization can be performed employing two different methods. In accordance with a first process, the graft polymer is dissolved or dispersed in an alcohol or in a water/alcohol mixture, mixed with a catalytic amount of an organic or inorganic acid and an aldehyde or aldehyde mixture, and heated. The resulting polymer solution, which where appropriate also contains an antioxidant, can either be used directly for preparing the mixtures according to this invention, or alternatively, the polymer can be precipitated and purified by dropwise adding the solution to a non-solvent.

In accordance with the second process, the graft polymer is dissolved in water and mixed with an aldehyde or aldehyde mixture. Subsequently, an aqueous solution of an inorganic or strong organic acid—if appropriate with the addition of a surfactant and of an antioxidant—is added dropwise at a low temperature. The acetalized graft polymer is precipitated. The reaction is completed at an increased temperature of about 20° to 60° C. The isolated polymer is purified by washing with water or re-precipitation.

To prepare the graft polyvinyl acetals in an aqueous medium, known methods are employed to produce about 1 to 50% strength, preferably about 5 to 20% strength, aqueous solutions of the graft polyvinyl alcohols, preferably at elevated temperatures. The acid catalyst is added, the solutions are then cooled to temperatures of less than about 25° C., and the acetalization reaction is finally performed by metering in the aldehyde with agitation, preferably within a time of about 3 to 300 minutes. As is known, the aldehyde conversion is incomplete in most cases, and therefore an excess of aldehyde, preferably of about 10 to 20 mole percent, is usually added.

In a preferred process variant, the aqueous solution is allowed to stand for at least about 30 minutes at temperatures of about 0° to 5° C. prior to the start of the reaction, whereupon the graft polyvinyl acetal formed is generally separated off after a short time, as a pulverulent substance. To complete the reaction, the reaction mixture is slowly heated to room temperature, and where appropriate it is post-reacted at elevated temperatures, for example at about 25° to 70° C., during about one to three hours. The added amount of acid catalyst depends, inter alia, on the degree of acetalization to be achieved and may preferably be up to about 1.1 mole, relative to the molar content of vinyl alcohol units.

The resulting graft polyvinyl acetal is isolated by suction, washed with weakly alkaline water (pH 9 to 12) and dried. Acetalization products which do not precipitate from the aqueous reaction solution can be isolated by the addition of precipitating agents, purified and dried.

The acetalization can also be performed in organic solvents. Suitable solvents include water-miscible solvents, in particular water-soluble alcohols, such as ethanol and/or methanol, to which water may be added.

Preferred acid catalysts are organic sulfonic acids, for example, toluene sulfonic acids, and also mineral acids, for example sulfuric acid, phosphoric acid, hydrochloric acid or nitric acid. Among these, preference is given to phosphoric acid and hydrochloric acid.

For performing the preparation in organic solvents, the acid catalyst, the aldehyde and the graft polyvinyl alcohol are dispersed or dissolved in the solvent, and the mixture is refluxed. It may also be expedient to add the aldehyde in the course of the reaction. The graft polyvinyl alcohols which are insoluble in the organic solvents gradually dissolve as a consequence of the acetalization in progress.

When the acetalization reaction is completed, the reaction product is precipitated by adding nonpolar solvents, for example, aliphatic hydrocarbons, or by pouring the reaction solution into ice-cold water or an ice-cold water/alcohol mixture, isolated by suction, washed with weakly alkaline water (pH 9 to 12), and dried.

The preparation of graft polyvinyl acetals is also described in German Patent Application P 38 35 840.9.

In combination with polymerizable compounds and photo-initiators, the polymers obtained in this way result in layers which can be developed easily and without scumming. Depending on their individual composition, the layers can be developed with aqueous solutions of inorganic salts and/or surfactants or with aqueous-alkaline solutions. The layers are distinguished by a high abrasion resistance, good ink acceptance and adequate shelf lives, and can therefore be used for numerous applications, in particular for producing planographic printing plates, screen printing stencils and photoresists.

In general, the photopolymerizable mixtures contain about 20 to 90, and preferably 30 to 75, % by weight of polymeric binder, relative to the weight of all non-volatile constituents of the mixture. Up to 50% by weight, preferably up to about 20% by weight, of the total amount of binder can be replaced by any of a great number of customary binders. Examples of suitable compounds include polyamides, polyvinyl esters, polyvinyl acetals, polyvinyl ethers, epoxide resins, polyacrylic acid esters, polymethacrylic acid esters, polyesters, alkyd resins, polyacryl amides, polyvinyl alcohols, polyethylene oxides, polydimethylacrylamide, polyvinylpyrrolidone, polyvinylmethylformamide, polyvinylmethylacetamide, and copolymers of the monomers forming the homopolymers enumerated.

Advantageously, these binders are also water-insoluble, but soluble or at least swellable in aqueous-alkaline solutions. Examples of polymers of this generic type include maleate resins, polymers of $\beta$-(methacryloyloxy)-ethyl ester of N-(p-tolylsulfonyl)-carbamic acid and copolymers of these and similar monomers with other monomers, as well as vinyl acetate/crotonic acid copolymers, styrene/maleic anhydride copolymers, alkyl methacrylate/methacrylic acid copolymers and copolymers of methacrylic acid, higher alkyl methacrylates and methyl methacrylate and/or styrene, acrylonitrile and others.

The mixtures and materials according to the invention contain free-radically polymerizable compounds with at least one terminal ethylenic double bond. Preferably, esters of acrylic or methacrylic acid with mono- or polyhydric, preferably primary, alcohols are used as the polymerizable compounds. Preferably, the polymerizable compounds should possess more than one, in particular 2 to 4, polymerizable groups. Examples of suitable polyhydric alcohols are ethylene glycol, propylene glycol, butane-1,4-diol, butane-1,3-diol, diethylene glycol, triethylene glycol or polyethylene glycols or polypropylene glycols with molecular weights from about 200 to 1,000, neopentyl glycol, glycerol, trimethylolethane, trimethylolpropane, pentaerythritol, bisphenol-A derivatives and reaction products of these compounds with ethylene oxide and/or propylene oxide. Bisacrylates and bis-methacrylates which contain urethane groups and which are obtained by the reaction of 1 mole of a diisocyanate with 2 moles of a hydroxyalkyl acrylate or hydroxyalkyl methacrylate are particularly suited. The diisocyanate may also be an oligomeric product obtained by the reaction of a diol with a molar excess of a monomeric diisocyanate. These and similar monomers containing urethane groups are described in DE 20 64 079, DE 28 22 190, DE 30 48 502 and DE 35 40 480.

In addition to the esters mentioned above, amides of acrylic or methacrylic acid can be employed. Examples are methylene-bis-(meth)acrylamide and m-xylylene-bis-(meth)acrylamide.

The amount of monomers contained in the mixture generally is about 10 to 80% by weight, preferably about 25 to 70% by weight, of the non-volatile constituents.

A large number of substances can be used as photo-initiators. Examples include benzoins; benzoin ethers; polynuclear quinones, such as 2-ethylanthraquinone; acridine derivatives, such as 9-phenylacridine or benzacridine; phenazine derivatives, such as 9,10-dimethylbenz(a)phenazine; quinoxaline derivatives or quinoline derivatives, such as 2,3-bis-(4-methoxyphenyl)quinoxaline or 2-styrylquinoline; quinazoline compounds; or acylphosphineoxide compounds. Photoinitiators of this type are described in DE 20 27 467, DE 20 39 861, DE 37 28 168, EP 0,011,786 and EP 0,220,589. Hydrazones, mercapto compounds, pyrylium salts or thiopyrylium salts, xanthones, thioxanthones, benzoquinones, acetophenones, benzophenones, synergistic mixtures with ketones or hydroxyketones and dyestuff redoxy systems may also be used. Particular preference is given to photo-initiators possessing photo-cleavable trihalomethyl groups, especially to corresponding compounds of the triazine or thiazoline series. Compounds of this type are described in DE 27 18 259, DE 33 33 450 and DE 33 37 024. 2-(4-Methoxystyryl)-4,6-bistrichloromethyl-s-triazine is a preferred example. It is advantageous to combine these compounds with photooxidizable dyes, photoreducible compounds, and optionally further coinitiators, as is described, for example, in EP 0,284,939 and EP 0,287,817.

The photo-initiators are generally employed in a quantity from about 0.1 to 15, and preferably from about 0.5 to 10, % by weight, relative to the non-volatile constituents of the mixture.

Depending on their intended use and on their desired properties, the photopolymerizable mixtures may contain a number of various additives, such as, for example, inhibitors to prevent thermal polymerization of the monomers, hydrogen donors, dyes, colored and uncolored pigments, color formers, indicators, plasticizers and chain transfer agents.

The types and quantities of such additions depend upon the field of application for which the photosensitive mixture is intended. In principle, care must be taken that the added substances do not absorb an excessive portion of the actinic light which is required for crosslinking, because this would result in a reduction of the practical sensitivity to light.

The photopolymerizable mixtures can also be combined with other, negative-working photosensitive compounds, in particular with diazonium salt polycondensation products. Suitable diazonium salt polycondensation products are condensation products of condensible aromatic diazonium salts, for example, of diphenylamine-4-diazonium salts, with aldehydes, preferably with formaldehyde. It is particularly advantageous to use cocondensation products containing, in addition to the diazonium salt units A-$N_2$X, other, non-photosensitive units B which are derived from condensible compounds, particularly from aromatic amines, phenols, phenol ethers, aromatic thioethers, aromatic hydrocarbons, aromatic heterocyclic compounds and organic acid amines. These condensation products are described in DE 20 24 244. Generally, all diazonium salt polycondensation products described in DE 27 39 774 are suitable.

The diazonium salt units A-$N_2$X are preferably derived from compounds corresponding to the formula ($R^1$—$R^2$—)$_p$$R^3$—$N_2$X, in which X is the anion of the diazonium compound,
p is an integer from 1 to 3,
$R^1$ is an aromatic radical which is capable, in at least one position, of condensation with an active carbonyl compound,
$R^3$ is an arylene group, preferably a phenylene group which may be substituted,
$R^2$ is a single bond or one of the groups:
—($CH_2$)$_1$—$NR^4$—,
—O—($CH_2$)$_r$—$NR^4$—,
—S—($CH_2$)$_r$—$NR^4$—,
—S—$CH_2$CO—$NR^4$—,
—O—$R^5$—O—,
—O—,
—S—, or
—CO—$NR^4$—,
where
q is a number from 0 to 5,
r is a number from 2 to 5,
$R^4$ is a hydrogen atom, an alkyl group having from 1 to 5 carbon atoms, an aralkyl group having from 7 to 12 carbon atoms or an aryl group having from 6 to 12 carbon atoms, and
$R^5$ is an arylene group having from 6 to 12 carbon atoms.

Further advantageous polycondensation products are obtained by condensing an optionally substituted diphenylamine diazonium salt first with an aromatic compound R'—O—$CH_2$—B and then with an aromatic compound R'—O—$CH_2$—B—$CH_2$—O—R', R' denoting a hydrogen atom, an alkyl radical or an aliphatic acyl radical, and B denoting the radical of any one of the condensible compounds listed above. These condensation products are described in detail in EP 126,875.

The diazonium salt polycondensation products are contained in the mixture in an amount of about 0 to 40% by weight, preferably of about 0 to 30% by weight, relative to the non-volatile constituents of the mixture.

In addition, the photopolymerizable mixtures can contain dyes and/or pigments which may serve to enhance the contrast upon exposure and also to harden the layer. Suitable dyes are, for example, specified in U.S. Pat. No. 3,218,167 and U.S. Pat. No. 3,884,693. Particularly suitable are, for example, Victoria Pure Blue FGA, Victoria Pure Blue BO (C.I. 42,595), Malachite Green, Victoria Blue B (C.I. 44,045), Renol Blue B2G-H (C.I. 74,160), Crystal Violet, Fatty Red 5B (C.I. 26,125), Neozapon Blue FLE (C.I. Solvent Blue 70), Brilliant Blue Salt Acetate, Samarone Navy-Blue, Orasol Blue GN, Zapon Fast Fire-Red B (C.I. 13,900:1) or Rhodamine 6 GDN (C.I. 45,160). To enhance the image contrast after exposure, Metanil Yellow (C.I. 13,065), Methyl Orange (C.I. 13,025) or phenylazodiphenylamine can be used.

The support material is coated from appropriate organic solvents or solvent mixtures, generally by flow-coating, spraying or dipping. The coating method depends on the desired layer thickness, the dried layers usually having thicknesses between about 0.5 and 200 $\mu$m.

Suitable supports are, for example, magnesium, zinc, copper, mechanically, chemically and electrochemically grained aluminum, anodically oxidized aluminum, steel, and also polyester film or cellulose acetate film, Perlon gauze, etc., the surface of which may have been subjected to a pretreatment. The support material may function as the final support or as a temporary support material from which the photosensitive layer is transferred by lamination to the workpiece to be processed.

During exposure of the mixture according to the invention, it is not absolutely necessary to exclude atmospheric oxygen. Nevertheless, it is generally favorable to keep the mixture away from the influence of atmospheric oxygen during the photopolymerization. When the mixture is used in the form of thin copying layers, it is advisable to apply a suitable protective film which is substantially impermeable to oxygen. This film can be self-supporting and can then be peeled off before development of the copying layer. For this purpose, polyester films, for example, are suitable. The protective film can also comprise a material which dissolves in the developer liquid or can be removed during development, at least from the non-hardened areas. Materials which are suitable for this purpose are, for example, polyvinyl alcohol, vinyl alcohol/vinyl acetate copolymers, polyvinylpyrrolidone, vinylpyrrolidone/vinyl acetate copolymers, polyacrylic acid, butadiene/maleic acid copolymers, polyvinylmethyl ethers, polyphosphates, sugars etc. Such protective layers generally have about 0.5 to 5 μm.

The recording material which is prepared using the photopolymerizable mixtures of the invention serves, on the one hand, to produce images on suitable supports or receptor sheets and, on the other hand, to produce reliefs which are used as printing plates, screens, resists, and the like.

In addition, it is also possible to use the photosensitive mixtures for the formulation of UV-hardenable printing inks or for the preparation of lacquers which are hardenable by ultraviolet radiation and may be used for the protection of surfaces.

Preferably, the mixtures are used for the production of lithographic printing plates, in which aluminum is the preferred support material. It is particularly preferred to pretreat the aluminum used for this purpose in the usual manner, for example, by a mechanical, chemical or electrochemical graining process which is optionally followed by an anodic oxidation. A further treatment of this support material, for example, with polyvinyl phosphonic acid, alkali metal silicate, phosphate, hexafluorozirconate, chromate, borate, polyacrylamide and cellulose derivatives is advantageous.

The recording materials obtained from the mixtures are processed in the conventional manner, by exposing imagewise and washing-out the unexposed areas of the layer with a suitable developer.

The recording material is exposed under an original, as is known in the art, using light sources which emit light with the highest possible spectral fraction in the near ultraviolet region. The material can also be exposed by laser irradiation. Suitable lasers for irradiation are shorter-wave lasers of adequate performance, for example, Ar lasers, krypton ion lasers, helium/cadmium lasers, emitting in the region between about 300 and 600 nm and, for some layers, even $CO_2$ lasers, which emit at about 10.6 μm, or YAG lasers emitting at about 1.06 μm.

As the developer solutions, neutral or preferably alkaline aqueous solutions are used, which have a pH value in the range from 8 to 14, preferably from 8.5 to 13, and which contain buffer salts, for example, water-soluble alkali metal phosphates, alkali metal silicates, alkali metal borates, alkali metal carbonates, alkali metal acetates or alkali metal benzoates. Additional constituents include wetting agents, preferably anionic wetting agents and, if appropriate, water-soluble polymers. The solution can also contain minor amounts, for example, up to about 5 percent by weight, preferably not more than about 2 percent by weight, of water-miscible organic solvents. It is preferred to use solvents that do not tend to volatilize, for example, araliphatic alcohols, the vapor pressure of which is of no consequence in the handling of the developer. Development can be performed in the conventional manner by dipping, spraying, brushing or wiping-over with a pad. If desired, the developed material can be treated with a gumming solution.

The photosensitive recording materials of this invention are distinguished by good reproduction properties and an adequate shelf life. They can be easily developed without scum, using developer solutions which from an ecological point of view are virtually neutral.

The large print runs and the good ink acceptance obtained with printing forms prepared using the material of the present invention are particularly advantageous. The printing stencils are also highly resistant to alkaline developers and other processing solutions. To achieve even higher print runs, the plates can be post-heated after exposure and/or the developed plates can be post-exposed. The preparation of the polyvinyl acetals used in the Examples is described below.

a) Preparation of polyurethane graft backbones In each case, the diol component and the catalyst were first introduced into a reaction vessel equipped with a stirrer and supplied with a nitrogen atmosphere, and the mixture was heated to a reaction temperature of between 65° C. and 100° C. Then the diisocyanate component was metered in, with care being taken to ensure that the temperature of the reaction mixture did not exceed about 120° C., and preferably did not exceed about 100° C. After the complete addition of the diisocyanate component, the mixture was post-heated to a temperature between about 80° C. and 100° C. for a period of up to two hours in order to complete the reaction. The completion of the conversion and thus the end of the reaction were determined by an analysis of the diisocyanate consumption with the aid of known methods (p.e., IR-spectroscopy, titration).

The detailed composition of the reaction mixtures used in the Examples and the calculated mean molecular weights ($\overline{M}_{calc}$) of the resulting polyurethanes (PU) are compiled in Table 1 below. The molecular weights result from the molar ratio diol component/diisocyanate, assuming a complete conversion of the NCO groups.

TABLE 1

| Polyurethane (PU) | Diol component PEG/PU (molar ratio) | Reaction temperature (°C.) | Molar ratio diol component/ diisocyanate | $\overline{M}_{calc}$ |
|---|---|---|---|---|
| A | 7:3 | 80 | 1:0.9 | 6,470 |
| B | 7:3 | 72 | 1:0.9 | 6,470 |
| C | 3:2 | 78 | 1:0.97 | 18,300 |
| D | 7:3 | 75 | 1:0.97 | 19,900 |
| E | 7:3 | 78 | 1:0.95 | 13,200 |

PEG = Polyethylene glycol, molecular weight 600
Bu = 1,4 butanediol

All products were prepared using isophorone diisocyanate as the diisocyanate component. In each case, 1,4-dimethylpiperazine was used as the catalyst in an amount of 0.48 mol %, relative to the diisocyanate.

b) Preparation of the graft polymers In each case, the polyurethane graft backbone was melted in a reaction vessel in a nitrogen atmosphere or was dissolved, respectively, by adding small amounts of methanol, and heated to a temperature between about 60° C. and 100° C. The monomers to be grafted on, which had optionally been dissolved in a solvent, e.g. methanol, including the free-radical initiator dissolved in the monomer, where then slowly metered to the polyurethane graft backbone, such that homopolymer formation was largely suppressed.

The maximum temperature of the reaction mixture should be about 120° C., more preferably about 100° C.

When the post-reaction was completed, excess monomer remainders were removed by azeotropic distillation with methanol. The composition of the individual reaction mixtures and the reaction parameters are compiled in Table 2 below.

TABLE 2

| Graft polymer | PU | VAc g/g PU | Cr g/g PU | Start temp. °C. | Metering time min | Post-react. min | Grafted-on monom. wt % | $J_o$ ml/g | calc. molecular weight |
|---|---|---|---|---|---|---|---|---|---|
| AV | A | 4 | 0 | 75 | 420 | 45 | 79.8 | 21.9 | 31,300 |
| BV | B | 2.32 | 0 | 73 | 420 | 45 | 69.3 | 18.3 | 21,000 |
| CV | C | 3.16 | 0 | 75 | 300 | 45 | 74.7 | 26.3 | 72,500 |
| DV | D | 3.16 | 0 | 75 | 420 | 45 | 74.5 | 28.7 | 78,000 |
| EVCr | E | 3.03 | 0.126 | 75 | 300 | 45 | 75.3 | 31.5 | 53,000 |

VAc = Vinyl acetate
$J_o$ = intrinsic viscosity
Cr = Crotonic acid

All products were prepared employing 0.2 mol % of dibenzoyl peroxide (relative to the monomer used in each case). The intrinsic viscosities were determined at 25° C. in tetrahydrofuran, using an Ostwald Viscosimeter, with the measured concentrations being selected such that a Hagenbach correction was not necessary. The grafted-on amount of monomer, in % by weight, is related to the weight of the total polymer.

c) Saponification of the qraft DolVmers The graft polymers of Table 2 were transesterified or saponified within two hours at room temperature. For this purpose, the products were dissolved in methanol to give 50% strength solutions and mixed with methanolic soda lye (10% strength). Depending on the added amount of alkali and the degree of grafting of the graft polymer, polymeric hydrolysis products having different degrees of hydrolysis were obtained. The resulting gels were granulated using conventional mills, and the granules were washed with methanol (where appropriate with an addition of acetic acid to neutralize the soda lye) and dried. The process parameters and results are compiled in Table 3 below.

TABLE 3

| Graft polyvinyl alcohol | Graft polyvinyl acetate | mole % of NaOH per ester unit | Degree of hydrolysis in % | $\bar{M}_{calc}$ |
|---|---|---|---|---|
| F | AV | 1.92 | 98.2 | 22,000 |
| G | BV | 5.00 | 98.9 | 14,000 |
| H | CV | 1.92 | 98.0 | 47,000 |
| I | DV | 1.97 | 98.4 | 44,000 |

TABLE 3-continued

| Graft polyvinyl alcohol | Graft polyvinyl acetate | mole % of NaOH per ester unit | Degree of hydrolysis in % | $\bar{M}_{calc}$ |
|---|---|---|---|---|
| K | EVCr | 2.00 | 94.5* | 36,000 |

*found by determination of the acid present following saponification; the crotonic acid present in the polymer is also measured.

d) Preparation of the graft polyvinyl acetals The graft polymers listed in Table 3 were dissolved in about eight times their amount of distilled water. The corresponding amount of aldehyde and a small amount of 2,6-di-tert.-butyl-4-methylphenol were added at room temperature. A solution comprising a small amount of sodium octyl sulfate, ⅓ of the weight amount of the aldehyde of concentrated hydrochloric acid and water was dropwise added to this solution, with agitation. The mixture was stirred for one hour at room temperature, then heated to 40° C., and stirring was continued for another two hours. Thereafter concentrated hydrochloric acid (the same weight amount as the aldehyde) was added and stirring was continued as 40° C. for a further two hours. When the mixture had cooled down to room temperature the aqueous phase was decanted from the precipitated polymer, the polymer was dissolved in ethanol and precipitated by pouring it into an excess amount of water. The polymer was dried in a vacuum drier at 40° C. until its weight remained constant.

TABLE 4

| Graft polyvinyl acetal | Graft polyvinyl alcohol | Aldehyde | OH-number |
|---|---|---|---|
| L | F | Pr + 4-ClBz 3) | 302 |
| M | G | Bu | 290 |
| N | H | Pr | 336 |
| O | I | i-Bu | 268 |
| P | K | Bu | 401 |
| Q | I | 4-CH$_3$OBz + Bu 1) | 214 |
| R | H | Pr + Bu 2) | 312 |

Bu = n-butyraldehyde
i-Bu = isobutyraldehyde
4-CH$_3$OBz = 4-methoxy-benzaldehyde
4-ClBz = 4-Chloro-benzaldehyde
Pr = propionaldehyde
1) Molar ratio 1:3
2) Molar ratio 1:2
3) Molar ratio 3:4

Preferred embodiments of the invention are described in the Examples which follow. In most cases, amounts are indicated in parts by weight (pbw). Unless otherwise specified, percentages and proportions are given in weight units.

EXAMPLE 1

A coating solution comprised of 1.20 pbw of polymer N,
1.00 pbw of a technical-grade mixture of pentaerythritol triacrylate and pentaerythritol tetraacrylate,
0.15 pbw of 2-(p-trichloromethyl-benzoyl-methylene)-3-ethyl-benzothiazoline, and
0.03 pbw of a blue azo dye obtained by coupling 2,4-dinitro-6-chloro-benzenediazonium salt with 2-methoxy-5-acetylamino-N-cyano-ethyl-N-hydroxyethyl-aniline, in
50.00 pbw of 2-methoxyethanol was applied to a 0.3 mm thick aluminum foil which had been electrochemically grained in nitric acid, anodically oxidized in sulfuric acid and post-treated with a 0.1% strength aqueous solution of polyvinyl phosphonic acid. Application was performed such that a dry layer weight of 1.1 g/m² resulted.

The plate was then coated with a 3.5% strength aqueous solution of polyvinyl alcohol (12% of residual acetyl groups, K value 4). After drying, a protective layer having a weight of 0.8 g/m² was obtained. The printing plate obtained was exposed for 40 seconds using a 5 kW metal halide lamp at a distance of 110 cm under a 13-step exposure wedge having density increments of 0.15 and on which a silver film of uniform optical density (density 1.57) and uniform absorption over the effective spectral range had additionally been mounted as neutral density filter. After exposure, the plate was developed in a developer of the following composition with the aid of a plush pad:

5.0 pbw of sodium octyl sulfate,
1.0 pbw of sodium metasilicate × 5 H₂O, and
94.0 pbw of distilled water.

The non-exposed layer areas were completely removed within a few seconds. Step 4 of the wedge step was rendered solid on the copy. Even the finest elements of the original were produced.

EXAMPLE 2

A coating solution was prepared from 1.000 pbw of polymer M,
1.500 pbw of trimethylolethane triacrylate,
0.200 pbw of 2,4-bis-trichloromethyl-6-(4-styryl phenyl)-s-triazine, and
0.015 pbw of Crystal Violet (C.I. 42,555), in
50.000 pbw of 2-methoxyethanol and applied to the layer support of Example 1, such that a dry layer weight of 1.5 g/m² was obtained.

A protective cover layer as described in Example 1 and having a weight of 0.6 g/m² was applied. Exposure and development were performed as in Example 1, with the exception that the exposure time was 18 seconds only.

EXAMPLE 3

A coating solution was prepared as in Example 1, except that polymer N was replaced by the same amount of polymer P. The solution was applied to a support material as described in Example 1, such that a dry layer weight of 1.3 g/m² was obtained. The cover layer had a weight of 0.8 g/m². Exposure and development were performed as in Example 1. A copy exhibiting excellent resolution and good ink acceptable was obtained.

EXAMPLE 4

A coating solution was prepared from 1.560 pbw of polymer L,
0.910 pbw of a diazonium salt polycondensation product prepared from 1 mole of 3-methoxy-diphenylamine-4-diazonium sulfate and 1 mole of 4,4'-bis-methoxy-methyl-diphenylether, isolated as mesitylene sulfonate,
0.049 pbw of phosphoric acid (85% strength),
0.162 pbw of 2-(4-methoxystyryl)-4,6-bis-trichloro-methyl-s-triazine,
1.750 pbw of a technical-grade mixture of pentaerythritol tri- and tetraacrylate and
0.550 pbw of the azo dye described in Example 1, in
70.000 pbw of butanone,
4.000 pbw of ethanol, and
2.000 pbw of butyl acetate and applied to an aluminum foil which had been electrochemically grained, anodically oxidized and post-treated with polyvinylphosphonic acid. A dry layer weight of 2.1 g/m² resulted.

The layer was exposed for 25 seconds through a negative original, with a solid step 4 being obtained on the test wedge. Development was performed with a developer having the following composition:

5.0 pbw of sodium octyl sulfate,
1.5 pbw of sodium metasilicate × 5 H₂O,
1.5 pbw of trisodium phosphate × 12 H₂O, and
92.5 pbw of distilled water.

The printing plate was clamped into a sheetfed offset press where it readily accepted printing ink with 280,000 good prints being obtained.

EXAMPLE 5

A coating solution was prepared from 2.50 pbw of polymer O,
5.60 pbw of a technical-grade mixture of pentaerythritol tri- and tetraacrylate,
0.20 pbw of the triazine specified in Example 4 and
0.03 pbw of the azo dye specified in Example 1, in
25.00 pbw of butanone,
2.00 pbw of ethanol, and
1.00 pbw of butyl acetate and spin-coated onto a 25 μm thick biaxially stretch-oriented and heat-set polyethylene terephthalate film, such that a layer weight of 35 g/m² resulted after drying at 100° C. The dry resist film prepared in this way laminated at 120° C. onto a phenoplast laminated board clad with a 35 μm thick copper foil, employing a customary laminating device. Exposure was performed for 25 seconds using a customary exposure device. The original used was a line original having line widths and spacings down to 80 μm. Following exposure, the polyester film was carefully peeled off, and the layer was developed in a spray developing station with the following developer, during 90 seconds:

| | |
|---|---|
| 5.0 pbw | of sodium octyl sulfate, |
| 1.5 pbw | of sodium metasilicate × 5 H₂O, |
| 1.5 pbw | of disodium hydrogen phosphate × 12 H₂O, in |
| 92.0 pbw | of distilled water. |

After development, the plate was rinsed with tap water for 30 seconds, etched for 30 seconds in a 15% strength ammonium peroxydisulfate solution and then electroplated in the following electroplating baths:
1. for 30 minutes in a copper bath from Messrs. Schloetter, Geislingen/Steige, West Germany, type "Glanzkupfer-Bad" (Brilliant Copper Bath). current density: 2.5 A/cm² metal build-up: about 12.5 μm
2. for 30 minutes in a nickel bath from the same manufacturers, type "Norma". current density: 4.0 A/cm² metal build-up: 9.0 μm The plate did not exhibit any damage or undercutting. Decoating was performed at a temperature of 50° C., using 5% strength KOH solution. The bared copper was etched away with customary etchants.

EXAMPLE 6

A coating solution comprised of

| | |
|---|---|
| 1.00 pbw | of polymer Q, |
| 1.00 pbw | of technical-grade mixture of pentaerythritol tri- and tetraacrylate, |
| 0.10 pbw | of 2,4-bis-trichloromethyl-6-(4-(ethoxy-naphth-1-yl)-s-triazine and |
| 0.02 pbw | of Victoria Pure Blue FGA (C.I. Basic Blue 81), in |
| 50.00 pbw | of propylene glycol monomethyl ether | was applied onto the aluminum support material described in Example 4, such that a dry layer weight of 1.3 g/m² was obtained. The resulting printing plate was exposed through a test original and developed with the developer specified in Example 5.

When clamped into the sheet-fed offset press, the printing form immediately accepted greasy printing ink. Even after a prolonged press standstill, the plate excellently accepted ink after printing 2 to 8 sheets. In the press, 95,000 good prints could be run, and even the finest lines were reproduced.

Four of the plates prepared as described above were stored at 100° C. in a drying oven for a period of 1 to 4 hours. After this heat treatment, the plates were imagewise exposed and developed with the developer solution specified above. To render visible any layer residues (toning) remaining in the non-image areas, the dried plates were dyed with a protective ink. The plates stored in the oven for 1 and 2 hours could be developed satisfactorily. They do not exhibit any substantial reduction of the continuous-tone step wedge. After a storage time of hours, the continuous-tone step wedge was reduced by one step. Development was insignificantly retarded. Development of the plate stored for 4 hours was slightly retarded. These results show that the mixtures according to this invention have a relatively good resistance to storage in the heat.

EXAMPLE 7

A coating solution comprised of

| | |
|---|---|
| 2.280 pbw | of polymer R, |
| 2.280 pbw | of pentaerythritol triacrylate, |
| 0.010 pbw | of phenylazodiphenylamine |
| 0.211 pbw | of the triazine of Example 2, and |
| 0.350 pbw | of Renol Blue B2G-H (C.I. 74,160) in |
| 70.000 pbw | of propylene glycol monomethyl ether | was applied to the support material described in Example 1, such that a dry layer weight of 2.5 g/m² was obtained. The photosensitive layer was exposed through a standard negative original for 12 seconds, using a 5 kW metal halide lamp. The photosensitive layer, which displayed good differentiation between exposed and non-exposed areas, was developed with the developer solution of Example 5 with the aid of a plush pad. The non-exposed layer areas were removed within 10 seconds after wetting with the developer solution. The plate was then rinsed with water and dried.

Step 4 of a silver film continuous-tone step wedge having an optical density range of 0.05 to 3.05 and density increments of 0.15 was reproduced solid on the copy. Even the finest screen dots and lines of the original were reproduced.

A layer of polyvinyl alcohol (12% residual acetyl groups, K-value 4) was applied to a printing plate prepared as described above, such that a dry layer weight of 0.8 g/m² was obtained. The photospeed of the photocurable layer was increased by 30% as a result of applying this oxygen barrier layer. When the two printing plates were clamped in a sheet-fed offset press, the plate provided with the protective cover layer produced much more prints than the plate without a cover layer, i.e., the print run was increased by 250%.

EXAMPLE 8

Following exposure, plates produced as in Example 7 (with and without an oxygen barrier layer) were subjected to a heat treatment at 100° C. for 1 minute and then developed. Two additional solid steps were obtained on the test wedge in each case, compared to the printing plates of Example 7, which had not been thermally post-treated.

Post-heating increased the print run as well. The increase was about 200% for the plate without a cover layer and about 100% for the plate with the cover layer. A post-exposure step represents another possibility of increasing the number of prints in a comparable way.

What is claimed is:
1. A photpolymerizable mixture, comprising:
   (a) a polymeric binder possessing repeating vinyl acetal units, said binder having a hydroxyl number of about 200 to 500,
   (b) a free-radically polymerizable compound possessing at least one terminal ethylenically-unsaturated group and having a boiling point of more than about 100° C. at normal pressure, and
   (c) a compound or a combination of compounds which, under the action of actinic light, is capable of initiating the polymerization of compound (b),
wherein binder (a) is present in the mixture in an amount sufficient to form a uniform film when a layer of the mixture is coated on a substrate and compounds (b) and (c) are present in an amount sufficient form polymerized areas that are insoluble in developer upon exposure to actinic radiation and wherein said binder is a graft polymer obtained from a polyurethane graft backbone, onto which chains containing vinyl alcohol units and vinyl acetal units are grafted, the amount of vinyl alcohol units being about 20 to 45 mol % and the amount of vinyl acetal units being about 20 to 45 mol % and the amount of vinyl acetal units being about 55 to 80 mol %, based in each case on the sum of vinyl alcohol and vinyl acetal units, wherein the polyurethane is a polyaddition product obtained from diisocyanates and diols.

2. The photpolymerizable mixture as claimed in claim 1, wherein the grafted-on chains additionally comprises vinyl ester units.

3. The photpolymerizable mixture as claimed in claim 1, wherein the vinyl acetal units are derived from an aliphatic or cycloaliphatic aldehyde.

4. The photopolymerizable mixture as claimed in claim 1, wherein the grafted-on chains additionally comprise units of other ethylenically-unsaturated monomers which are copolymerizable with vinyl esters.

5. The photopolymerizable mixture as claimed in claim 1, wherein the diol is selected from the group consisting of an aliphatic diol having 2 to 12 carbon atoms, a cycloaliphatic diol having 5 to 10 carbon atoms and an aliphatic polydiol having a molecular weight between about 200 and 10,000.

6. The photopolymerizable mixture as claimed in claim 5, wherein the diol is a mixture comprising 1 mol of polydiol and 0.1 to 0.7 mol of low molecular weight aliphatic diol.

7. The photopolymerizable mixture as claimed in claim 1, wherein the diisocyanate is selected from the group consisting of an aliphatic diisocyanate having 4 to 15 carbon atoms or a cycloaliphatic diisocyanate having 7 to 15 carbon atoms.

8. The photopolymerizable mixture as claimed in claim 1, wherein the polyurethane has a molecular weight between about 200 and 100,000.

9. The photpolymerizable mixture as claimed in claim 1, wherein the compound which can be polymerized by a free-radical process is an acrylate or methacrylate of a mono- or polyhydric alcohol or an acrylic or methacrylic acid amide.

10. The photopolymerizable mixture as claimed in claim 1, comprising about 20 to 95% by weight of graft polymer, about 5 to 70% by weight of polymerizable compounds, and about 0.1 to 15% by weight of compound (c).

11. The photopolymerizable mixture as claimed in claim 1, additionally comprising a diazonium salt polycondensation product.

12. The photpolymerizable mixture as claimed in claim 1, consisting essentially of the recited ingredients.

13. A photopolymerizable recording material comprising a layer support and a photopolymerizable layer, wherein the photopolymerizable layer comprises a mixture as claimed in claim 1.

* * * * *

UNITED STATES PATENT AND TRADEMARK OFFICE
CERTIFICATE OF CORRECTION

PATENT NO. : 5,238,772
DATED : August 24, 1993
INVENTOR(S) : Waltraud MUELLER-HESS et al.

It is certified that error appears in the above-indentified patent and that said Letters Patent is hereby corrected as shown below:

Claim 1, Column 16, Line 50, "photpolymerizable" should read —photopolymerizable—;
Column 17, Line 2, please delete "and the";
Line 3, please delete "amount of vinyl acetal units being about 20 to 45 mol %".

Claim 2, Column 17, Line 9, "photpolymerizable" should read —photopolymerizable—;
Line 10, "comprises" should read —comprise—.

Claim 3, Column 17, Line 12, "photpolymerizable" should read —photopolymerizable—.

Claim 4, Column 17, Line 15, "photpolymerizable" should read —photopolymerizable—.

Claim 6, Column 17, Line 26, "claim 5" should read —claim 1—.

Claim 9, Column 18, Line 9, "photpolymerizable" should read —photopolymerizable—.

UNITED STATES PATENT AND TRADEMARK OFFICE
CERTIFICATE OF CORRECTION

PATENT NO. : 5,238,772
DATED : August 24, 1993
INVENTOR(S) : Waltraud MUELLER-HESS et al.

Page 2 of 2

It is certified that error appears in the above-indentified patent and that said Letters Patent is hereby corrected as shown below:

Claim 12, Column 18, Line 22, "photpolymerizable" should read --photopolymerizable--.

Signed and Sealed this

Twenty-first Day of June, 1994

Attest:

BRUCE LEHMAN

Attesting Officer

Commissioner of Patents and Trademarks